(12) United States Patent
Ong et al.

(10) Patent No.: US 12,302,628 B2
(45) Date of Patent: May 13, 2025

(54) INTEGRATED CHIP WITH SOLID-STATE POWER STORAGE DEVICE

(71) Applicant: Taiwan Semiconductor Manufacturing Company, Ltd., Hsinchu (TW)

(72) Inventors: Yi Ching Ong, Hsinchu (TW);
Kuen-Yi Chen, Hsinchu (TW);
Yi-Hsuan Chen, Taoyuan (TW);
Kuo-Ching Huang, Hsinchu (TW);
Harry-Hak-Lay Chuang, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 420 days.

(21) Appl. No.: 17/570,685

(22) Filed: Jan. 7, 2022

(65) Prior Publication Data
US 2022/0415883 A1  Dec. 29, 2022

Related U.S. Application Data

(60) Provisional application No. 63/214,290, filed on Jun. 24, 2021.

(51) Int. Cl.
| H01L 23/495 | (2006.01) |
| H01L 23/538 | (2006.01) |
| H01M 10/05 | (2010.01) |
| H01M 50/11 | (2021.01) |
| H10D 84/40 | (2025.01) |

(52) U.S. Cl.
CPC ....... *H10D 84/40* (2025.01); *H01L 23/49593* (2013.01); *H01L 23/5385* (2013.01); *H01L 23/5386* (2013.01)

(58) Field of Classification Search
CPC .......... H01L 23/49593; H01L 23/5385; H01L 23/5386; H01L 23/58; H01L 23/522; H01M 10/05; H01M 10/0562; H01M 10/058; H01M 50/11; H10D 84/40
See application file for complete search history.

(56) References Cited

U.S. PATENT DOCUMENTS

| 2009/0186248 A1* | 7/2009 | Ye ....................... H01M 4/9083 |
| | | 429/535 |
| 2009/0258295 A1* | 10/2009 | Niessen .............. H01M 10/425 |
| | | 429/231.95 |
| 2020/0075851 A1* | 3/2020 | Karpov ................. H10N 70/826 |
| 2020/0203604 A1* | 6/2020 | Pillarisetty ......... H10N 70/8828 |
| 2020/0373575 A1* | 11/2020 | Tsunokuni ............ H01M 10/36 |

OTHER PUBLICATIONS

Choi et al. "Achieving high energy density and high power density with pseudocapacitive materials" Nature Reviews Materials 5, 5-19, published in 2020.

* cited by examiner

*Primary Examiner* — Omar F Mojaddedi
(74) *Attorney, Agent, or Firm* — Eschweiler & Potashnik, LLC

(57) ABSTRACT

The present disclosure relates to an integrated chip including a first metal layer over a substrate. A second metal layer is over the first metal layer. An ionic crystal layer is between the first metal layer and the second metal layer. A metal oxide layer is between the first metal layer and the second metal layer. The first metal layer, the second metal layer, the ionic crystal layer, and the metal oxide layer are over a transistor device that is arranged along the substrate.

20 Claims, 23 Drawing Sheets

INTEGRATED CHIP WITH SOLID-STATE POWER STORAGE DEVICE

REFERENCE TO RELATED APPLICATION

This application claims the benefit of U.S. Provisional Application No. 63/214,290, filed on Jun. 24, 2021, the contents of which are hereby incorporated by reference in their entirety.

BACKGROUND

As technology advances at a rapid pace, engineers work to make devices smaller, yet more complex to improve and develop electronic devices that are more efficient, more reliable, and have more capabilities. One way to achieve these goals is by improving the design of integrated chips. Overall electronic device performance may benefit from integrated chips that, for example, are smaller, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
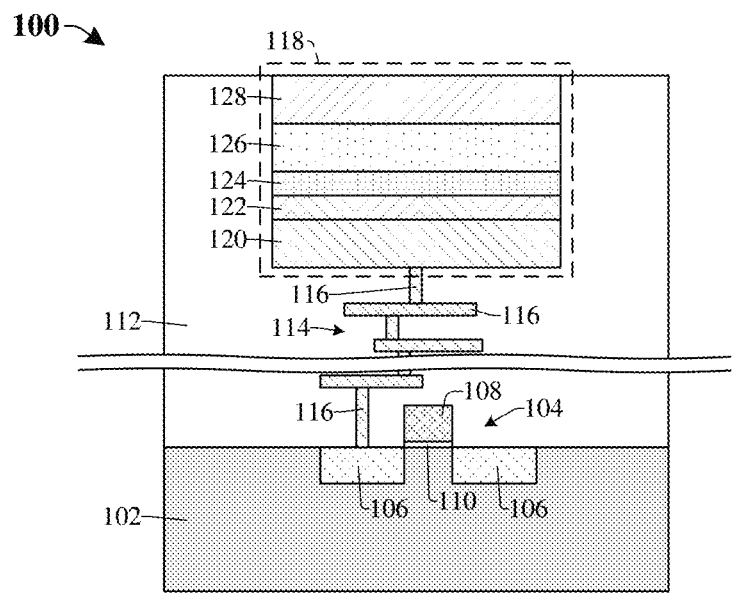
FIG. 1 illustrates a cross-sectional view of some embodiments of an integrated chip comprising a solid-state power storage device over a transistor device that is arranged along a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some devices include integrated chips powered by batteries. For example, some devices include an integrated chip and a separate battery (e.g., a battery that is external to the integrated chip) coupled to the integrated chip by way of an external connector. The integrated chip may include a transistor device. The separate battery may be coupled to the transistor device by way of the external connector and may be configured to provide power to the transistor device.

A challenge with these devices is that the battery may have a large volume. Thus, a size of the device comprising the battery and the integrated chip may be increased. Further, a cost of producing the device may be increased. Another challenge with these devices is that the external connector may be prone to failure. Thus, a reliability of the device may be reduced.

Various embodiments of the present disclosure are related to an integrated chip comprising a solid-state power storage device over a transistor device. For example, the integrated chip includes a substrate, a transistor device arranged along the substrate, a dielectric structure over the substrate and extending along the substrate, and a plurality of wires within the dielectric structure. The integrated chip further includes the solid-state power storage device arranged over the transistor device and within the dielectric structure.

The solid-state power storage device includes a first metal layer over the plurality of wires. A second metal layer is over the first metal layer. An ionic crystal layer is between the first metal layer and the second metal layer. A metal oxide layer is between the first metal layer and the second metal layer. A hydrous metal oxide layer is between the ionic crystal layer and the metal oxide layer. The first metal layer, the second metal layer, the ionic crystal layer, the metal oxide layer, and the hydrous metal oxide layer are arranged within the dielectric structure. In some examples, the solid-state power storage device is configured to provide power to the transistor device.

By including the solid-state power storage device in the integrated chip over the transistor device, the integrated chip may be powered without an external or separate battery. In addition, a volume of the integrated chip may be reduced relative to a volume of a device comprising an integrated chip and a separate battery coupled to the integrated chip.

Further, by including the solid-state power storage device in the integrated chip, a cost of producing the integrated chip may be reduced relative to a cost of producing a device comprising an integrated chip and a separate battery coupled to the integrated chip. Furthermore, by including the solid-state power storage device in the integrated chip, the integrated chip can be coupled to the solid-state power storage device without an external connector. Thus, a reliability of the integrated chip may be improved relative to a reliability a device comprising an integrated chip and a separate battery coupled to the integrated chip by way of an external connector that may be prone to failure.

FIG. 1 illustrates a cross-sectional view 100 of some embodiments of an integrated chip comprising a solid-state power storage device 118 over a transistor device 104 that is arranged along a substrate 102.

In some embodiments, the transistor device 104 comprises a pair of source/drains 106 within the substrate 102, a gate structure 108 over the substrate 102, and a gate dielectric 110 between the gate structure 108 and the substrate 102. A dielectric structure 112 extends along a top surface of the substrate 102. The dielectric structure 112 comprises a plurality of dielectric layers. An interconnect structure 114 comprising a plurality of metal wires 116 is within the dielectric structure 112.

The solid-state power storage device 118 is over the transistor device 104 and within the dielectric structure 112. The solid-state power storage device 118 comprises a first metal layer 120 over the interconnect structure 114. A metal oxide layer 122 is on the first metal layer 120. A hydrous metal oxide layer 124 is on the metal oxide layer 122. An ionic crystal layer 126 is on the hydrous metal oxide layer 124. A second metal layer 128 is on ionic crystal layer 126. The first metal layer 120, the metal oxide layer 122, the hydrous metal oxide layer 124, the ionic crystal layer 126, and the second metal layer 128 are arranged within the dielectric structure 112. In some embodiments, the ionic crystal layer 126 may, for example, comprise aluminum nitride or some other suitable material (e.g., as described in further detail with regard to FIG. 10).

In some embodiments, the first metal layer 120 of the solid-state power storage device 118 is on a metal wire 116 of the interconnect structure 114. In some embodiments, the solid-state power storage device 118 is coupled to the transistor device 104 by metal wires 116 of the interconnect structure 114. In some embodiments, the solid-state power storage device 118 is configured to provide power to the transistor device 104.

The solid-state power storage device 118 may be charged by applying a voltage across the first metal layer 120 and the second metal layer 128. In some instances, a more positive voltage may be applied to the second metal layer 128 and a less positive voltage may be applied to the first metal layer 120. During charging, positively charged ions (e.g., aluminum ions) from the ionic crystal layer 126 may flow toward and gather along the interface between the hydrous metal oxide layer 124 and the ionic crystal layer 126 (e.g., where the hydrous metal oxide layer 124 meets the ionic crystal layer 126 along a bottom surface of the ionic crystal layer 126). Further, negatively charged ions (e.g., nitrogen ions) from the ionic crystal layer 126 may flow toward and gather along the interface between the ionic crystal layer 126 and the second metal layer 128 (e.g., where the ionic crystal layer 126 meets the second metal layer 128 along a top surface of the ionic crystal layer 126).

The solid-state power storage device 118 may store charge when the charging voltage is removed. For example, when the charging voltage is removed, the positively charged ions may remain along the interface between the hydrous metal oxide layer 124 and the ionic crystal layer 126 and the negatively charged ions may remain along the interface between the ionic crystal layer 126 and the second metal layer 128. Thus, the charge of the solid-state power storage device 118 may be stored.

The solid-state power storage device 118 may be discharged by applying a load across the first metal layer 120 and the second metal layer 128. During discharging, the positively charge ions may flow from along the interface between the hydrous metal oxide layer 124 and the ionic crystal layer 126 toward the negatively charged ions along the interface between the ionic crystal layer 126 and the second metal layer 128. Similarly, the negatively charged ions may flow from along the interface between the ionic crystal layer 126 and the second metal layer 128 toward the positively charged ions along the interface between the hydrous metal oxide layer 124 and the ionic crystal layer 126. This flow of ions may generate a current which may power the load coupled to the solid-state power storage device 118. The positively charged ions and the negatively charged ions may then recombine when they meet within the ionic crystal layer 126. In some embodiments, the transistor device 104 may be included in the load.

By including the solid-state power storage device 118 in the integrated chip over the transistor device 104, the transistor device 104 may be powered without an external or separate battery. In addition, a volume of the integrated chip may be reduced (e.g., relative to a volume of a device comprising an integrated chip and a separate battery coupled to the integrated chip). This may be particularly beneficial for some devices such as, for example, wearable devices or radio-frequency identification (RFID) devices. Further, by including the solid-state power storage device 118 in the integrated chip, a cost of producing the integrated chip may be reduced (e.g., relative to a cost of producing a device comprising an integrated chip and a separate battery coupled to the integrated chip). Furthermore, by including the solid-state power storage device 118 in the integrated chip, the transistor device 104 of the integrated chip can be coupled to the solid-state power storage device 118 without an external connector. Thus, a reliability of the integrated chip may be improved (e.g., relative to a reliability a device comprising an integrated chip and a separate battery coupled to the integrated chip by way of an external connector that may be prone to failure).

Figure 2:
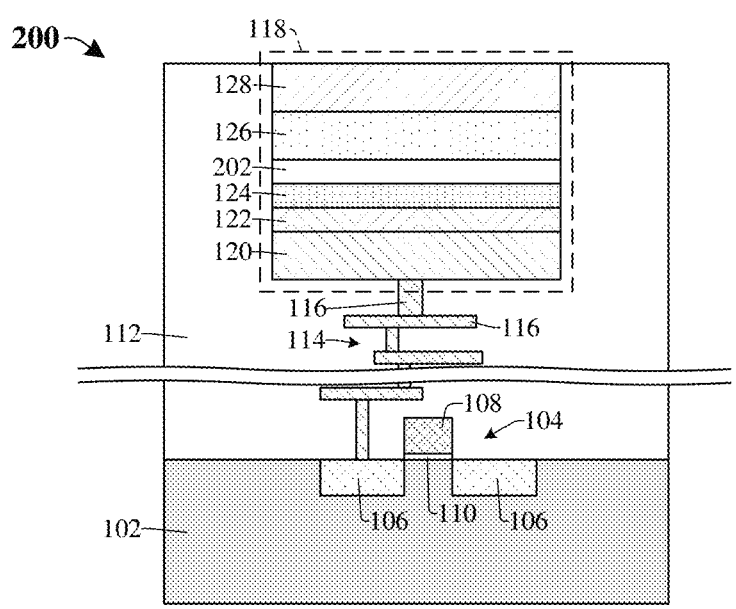
FIG. 2 illustrates a cross-sectional view of some embodiments of the integrated chip of FIG. 1 in which the solid-state power storage device comprises a dielectric layer.

FIG. 2 illustrates a cross-sectional view 200 of some embodiments of the integrated chip of FIG. 1 in which the solid-state power storage device 118 further comprises a dielectric layer 202.

The dielectric layer 202 is between the hydrous metal oxide layer 124 and the ionic crystal layer 126. For example, the dielectric layer 202 is on the hydrous metal oxide layer 124 and the ionic crystal layer 126 is on the dielectric layer 202. The dielectric layer 202 may be included in the integrated chip to provide insulation between the ionic crystal layer 126 and the hydrous metal oxide layer 124 to improve a performance of the solid-state power storage device 118. During charging, positively charged ions may diffuse through the dielectric layer 202 and gather along an interface between the dielectric layer 202 and the hydrous metal oxide layer 124 (e.g., where the hydrous metal oxide layer 124 meets the dielectric layer 202 along a bottom surface of the dielectric layer 202). During discharging, the positively charged ions may diffuse back through the dielectric layer 202 toward the second metal layer 128.

In some embodiments, the thickness of the dielectric layer 202 is substantially small. For example, the thickness of the dielectric layer 202 is less than the thickness of the ionic crystal layer 126, is about 1 to 2 nanometers, is less than 2 nanometers, is less than 1 nanometer, or is some other suitable thickness. In such embodiments, the thickness of the dielectric layer 202 is substantially small so that positively charged ions can diffuse through the dielectric layer 202 to the interface between the dielectric layer 202 and the hydrous metal oxide layer 124. In some instances, if a thickness of the dielectric layer 202 is too large, positively charged ions may not be able to diffuse through the dielectric layer 202 to the interface between the dielectric layer 202 and the hydrous metal oxide layer 124 and thus a performance of the solid-state power storage device 118 may be reduced.

Figure 3:
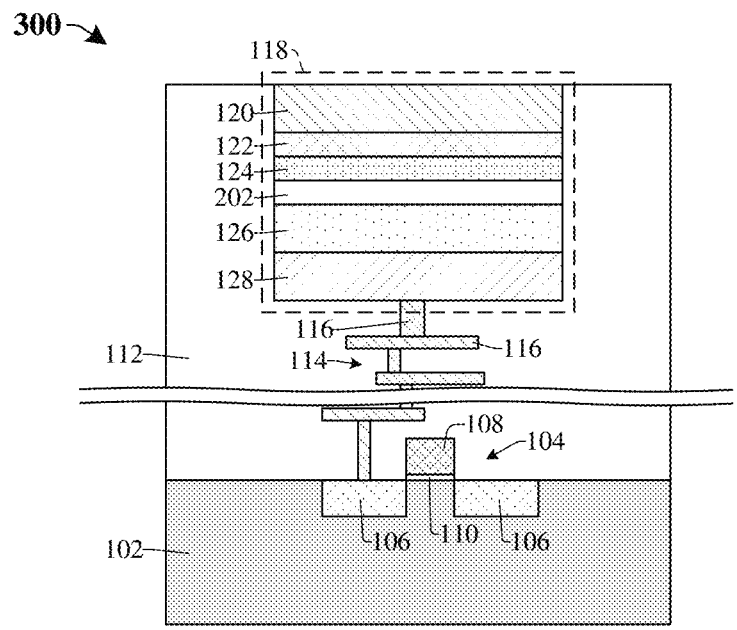
FIG. 3 illustrates a cross-sectional view of some embodiments of the integrated chip of FIG. 2 in which an orientation of the solid-state power storage device is flipped vertically.

FIG. 3 illustrates a cross-sectional view 300 of some embodiments of the integrated chip of FIG. 2 in which an orientation of the solid-state power storage device 118 is flipped vertically.

The second metal layer 128 is on a metal wire 116 of the interconnect structure 114. The ionic crystal layer 126 is on the second metal layer 128. In some embodiments where the solid-state power storage device 118 includes the dielectric layer 202, the dielectric layer 202 is on the ionic crystal layer 126 and the hydrous metal oxide layer 124 is on the dielectric layer 202. In some other embodiments where the solid-state power storage device 118 is devoid of the dielectric layer 202, the hydrous metal oxide layer 124 is on the ionic crystal layer 126. The metal oxide layer 122 is on the hydrous metal oxide layer 124. The first metal layer 120 is on the metal oxide layer 122. In some embodiments, the orientation of the solid-state power storage device 118 in FIGS. 1 and/or 2 may be referred to as a first orientation and the orientation of the solid-state power storage device 118 in FIG. 3 may be referred to as a second orientation.

In some embodiments where the first metal layer 120 is over the second metal layer 128, the second metal layer 128 may alternatively be referred to as the first metal layer and the first metal layer 120 may alternatively be referred to as the second metal layer (i.e., whichever metal layer is the lower metal layer may be referred to as the first metal layer and whichever metal layer is the upper metal layer may be referred to as the second metal layer).

FIGS. 4, 5, 6, 7, 8, and 9 illustrate cross-sectional views 400, 500, 600, 700, 800, and 900, respectively, of some embodiments of the integrated chip of FIG. 2 in which the layers of the solid-state power storage device 118 have varying shapes.

Figure 4:
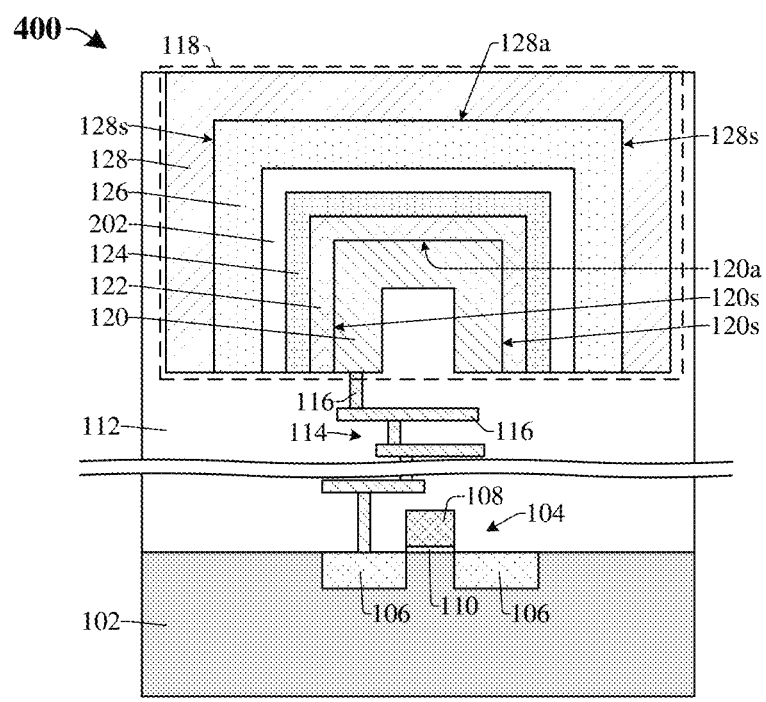
FIGS. 4-9 illustrate cross-sectional views of some embodiments of the integrated chip of FIG. 2 in which layers of the solid-state power storage device have varying shapes.
Figure 5:
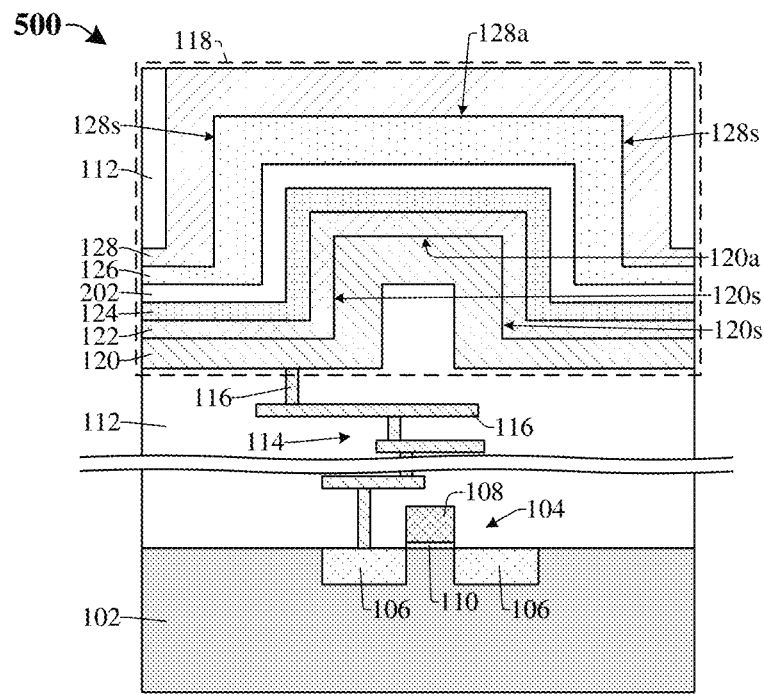

As illustrated in cross-sectionals view 400 and 500 of FIGS. 4 and 5, in some embodiments, the first metal layer 120, the metal oxide layer 122, the hydrous metal oxide layer 124, the dielectric layer 202, the ionic crystal layer 126, and the second metal layer 128 have arch shapes or inverted U shapes. In such embodiments, the metal oxide layer 122, the hydrous metal oxide layer 124, the dielectric layer 202, and the ionic crystal layer 126 extend between an upper surface 120a of the first metal layer 120 and a lower surface 128a of the second metal layer 128, and between sidewalls 120s (e.g., outer sidewalls) of the first metal layer 120 and sidewalls 128s (e.g., inner sidewalls) of the second metal layer 128.

Figure 6:
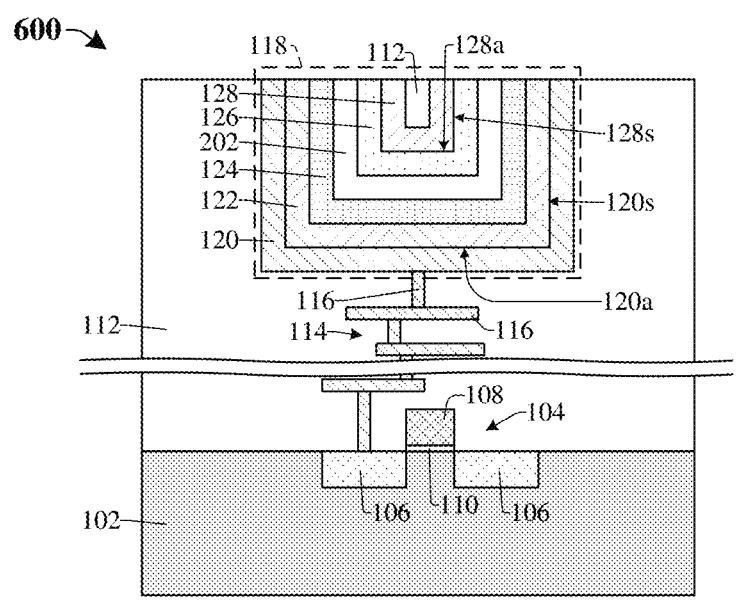

As illustrated in cross-sectional view 600 of FIG. 6, in some embodiments, the first metal layer 120, the metal oxide layer 122, the hydrous metal oxide layer 124, the dielectric layer 202, the ionic crystal layer 126, and the second metal layer 128 have trench shapes or U shapes. In such embodiments, the metal oxide layer 122, the hydrous metal oxide layer 124, the dielectric layer 202, and the ionic crystal layer 126 extend between an upper surface 120a of the first metal layer 120 and a lower surface 128a of the second metal layer 128, and between sidewalls 120s (e.g., inner sidewalls) of the first metal layer 120 and sidewalls 128s (e.g., outer sidewalls) of the second metal layer 128.

Figure 7:
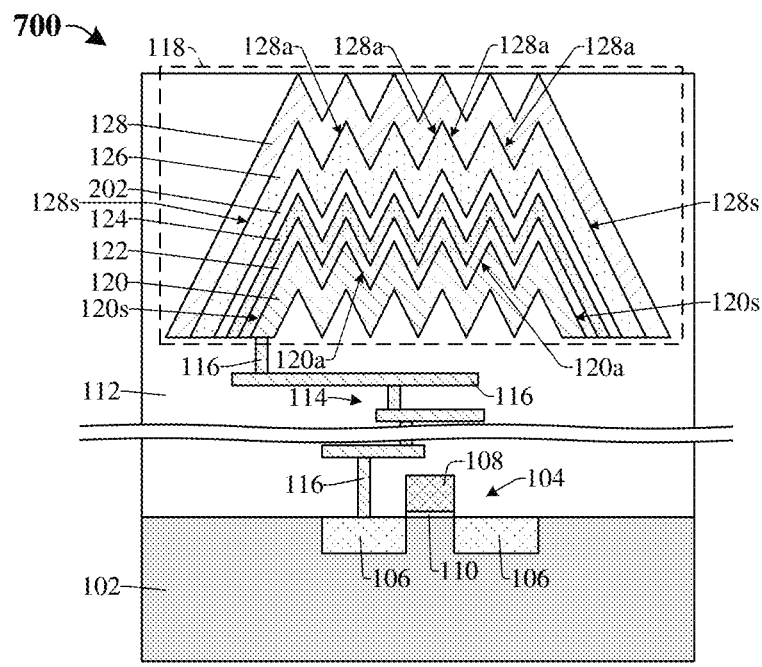
Figure 8:
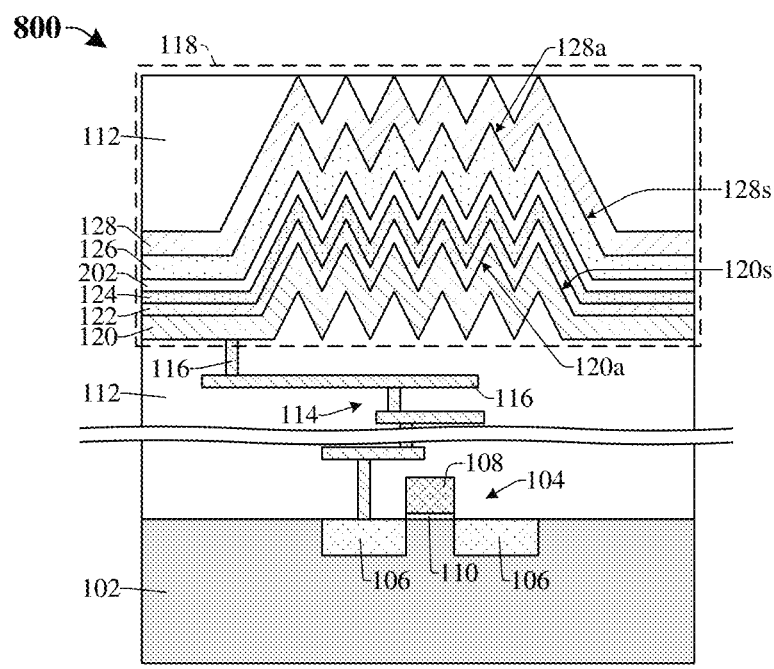

As illustrated in cross-sectional views 700 and 800 of FIGS. 7 and 8, in some embodiments, the first metal layer 120, the metal oxide layer 122, the hydrous metal oxide layer 124, the dielectric layer 202, the ionic crystal layer 126, and the second metal layer 128 have zig-zag shapes. In such embodiments, the metal oxide layer 122, the hydrous metal oxide layer 124, the dielectric layer 202, and the ionic crystal layer 126 extend between a plurality of upper surfaces 120a (e.g., slanted upper surfaces) of the first metal layer 120 and a plurality of lower surfaces 128a (e.g., slanted lower surfaces) of the second metal layer 128, and between sidewalls 120s (e.g., outer sidewalls) of the first metal layer 120 and sidewalls 128s (e.g., inner sidewalls) of the second metal layer 128.

Figure 9:
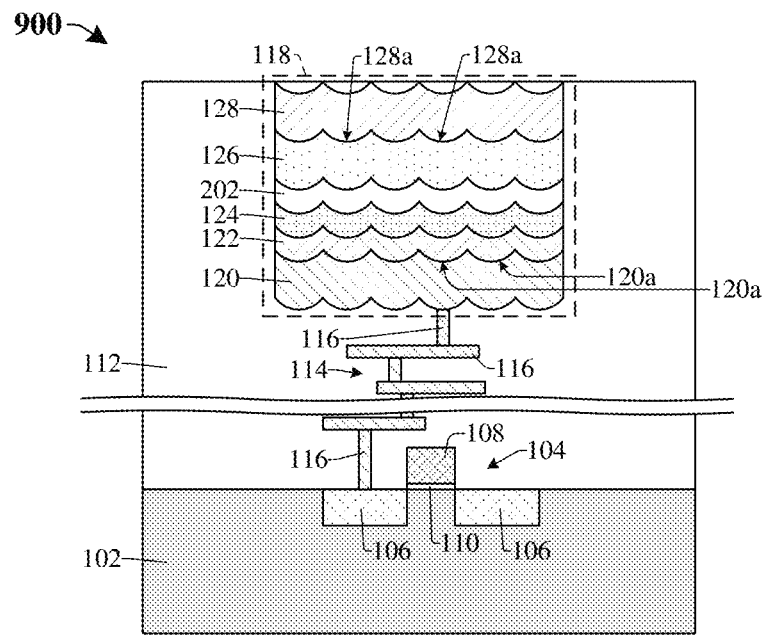

As illustrated in cross-sectional view 900 of FIG. 9, in some embodiments, the first metal layer 120, the metal oxide layer 122, the hydrous metal oxide layer 124, the dielectric layer 202, the ionic crystal layer 126, and the second metal layer 128 have wave shapes or crater shapes. In such embodiments, the metal oxide layer 122, the hydrous metal oxide layer 124, the dielectric layer 202, and the ionic crystal layer 126 extend between a plurality of upper surfaces 120a (e.g., curved upper surfaces) of the first metal layer 120 and a plurality of lower surfaces 128a (e.g., curved lower surfaces) of the second metal layer 128.

By forming the layers of the solid-state power storage device 118 so that they have varied (e.g., non-linear) shapes and/or surfaces, a surface area of the layers of the solid-state power storage device 118 may be increased. Increasing a surface area of the layers of the solid-state power storage device 118 may increase a power storage capacity of the solid-state power storage device 118. Thus, the surface variations may increase a performance of the solid-state power storage device 118.

Figure 10:
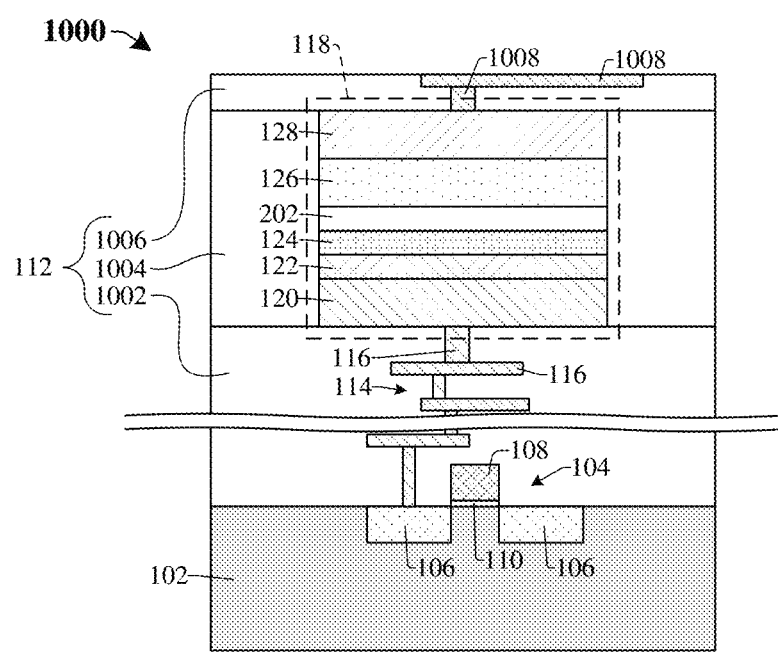
FIG. 10 illustrates a cross-sectional view of some embodiments of the integrated chip of FIG. 2 in which the integrated chip comprises one or more metal wires over the solid-state power storage device.

FIG. 10 illustrates a cross-sectional view 1000 of some embodiments of the integrated chip of FIG. 2 in which the integrated chip further comprises one or more metal wires 1008 over the solid-state power storage device 118.

In some embodiments, the dielectric structure 112 comprises one or more first dielectric layers 1002, one or more second dielectric layers 1004 over the first dielectric layer(s) 1002, and one or more third dielectric layers 1006 over the second dielectric layer(s) 1004. For example, the interconnect structure 114 is disposed within the first dielectric layer(s) 1002, the solid-state power storage device 118 is disposed within the second dielectric layer(s) 1004, and the third dielectric layer(s) 1006 are over the solid-state power storage device 118. In some embodiments, the one or more metal wires 1008 are disposed within the third dielectric layer(s) 1006 over the solid-state power storage device 118.

In some embodiments, the first dielectric layer(s) 1002, the second dielectric layer(s) 1004, and the third dielectric layer(s) 1006 of the dielectric structure 112 comprise silicon dioxide, silicon nitride, or some other suitable material. In some embodiments, the metal wires 116, 1008 may be or comprise metal lines, metal vias, or the like and may comprise tungsten, copper, aluminum, titanium, cobalt, or some other suitable material(s).

In some embodiments, the ionic crystal layer 126 comprises a metal halide, a metal oxide, a metal nitride, a metal sulfide, or some other suitable material. For example, the ionic crystal layer 126 may comprise rubidium silver iodide, silver chloride, silver bromide, silver iodide, lead fluoride, aluminum nitride, cerium oxide, thorium oxide, a mixture of zirconium oxide and yttrium oxide, or some other suitable material. In some embodiments, the ionic crystal layer 126 has an ionic conductivity of greater than 10-5 Siemens per centimeter in temperatures of about −40 to 125 degrees Celsius. In some embodiments, the ionic crystal layer 126 may be referred to as a solid-state electrolyte layer. In some embodiments, the ionic crystal layer 126 has a thickness of about 10 nanometers to about 100 nanometers or some other suitable thickness.

In some embodiments, the first metal layer 120 comprises a first metal and the second metal layer 128 comprises a second metal different from the first metal. In some embodiments, the first metal layer 120 comprises ruthenium, some other transition metal, or some other suitable material. In some embodiments, the first metal layer 120 has a thickness of about 3 nanometers to about 100 nanometers or some other suitable thickness. In some embodiments, the second metal layer 128 comprises titanium nitride, aluminum, ruthenium, or some other suitable material. In some embodiments, the second metal layer 128 has a thickness of about 3 nanometers to about 100 nanometers or some other suitable thickness.

In some embodiments, the metal oxide layer 122 comprises the first metal and is oxidized. For example, in some embodiments, the metal oxide layer 122 comprises ruthenium oxide, some other transition metal oxide, or some other suitable material. In some embodiments, the metal oxide layer 122 has a thickness of about 0.1 nanometers to about 5 nanometers or some other suitable thickness. In some embodiments, the hydrous metal oxide layer 124 comprises hydrous ruthenium oxide, some other hydrous transition metal oxide, or some other suitable material. In some embodiments, the hydrous metal oxide layer 124 has a thickness of about 0.1 nanometers to about 2 nanometers or some other suitable thickness.

In some embodiments, the dielectric layer 202 may, for example, comprise aluminum oxide, hafnium oxide, zirconium oxide, some other high-k dielectric (e.g., a dielectric having a dielectric constant greater than that of silicon dioxide), or some other suitable material.

In some embodiments, the transistor device 104 may, for example, be or comprise a metal-oxide-semiconductor field effect transistor (MOSFET), a junction field effect transistor (JFET), a bipolar junction transistor (BJT), a fin field effect transistor (FinFET), a gate all-around field effect transistor (GAA FET), or some other suitable switching device.

FIGS. 11, 12, 13A, 13B, 14A, 14B, 15A, 15B, 16A, 16B, 17A, 17B, 18A, 18B and 19-22 illustrate cross-sectional views 1100, 1200, 1300a, 1300b, 1400a, 1400b, 1500a, 1500b, 1600a, 1600b, 1700a, 1700b, 1800a, 1800b and 1900-2200 of some embodiments of a method for forming an integrated chip comprising a solid-state power storage device 118 over a transistor device 104. Although FIGS. 11, 12, 13A, 13B, 14A, 14B, 15A, 15B, 16A, 16B, 17A, 17B, 18A, 18B and 19-22 are described in relation to a method, it will be appreciated that the structures disclosed in FIGS. 11, 12, 13A, 13B, 14A, 14B, 15A, 15B, 16A, 16B, 17A, 17B, 18A, 18B and 19-22 are not limited to such a method, but instead may stand alone as structures independent of the method.

Figure 11:
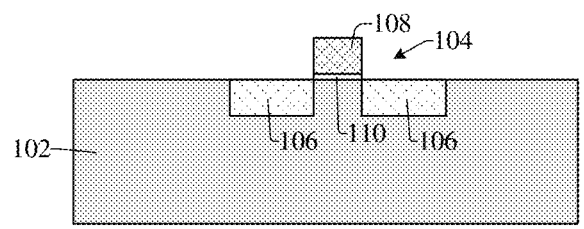
FIGS. 11, 12, 13A, 13B, 14A, 14B, 15A, 15B, 16A, 16B, 17A, 17B, 18A, 18B and 19-22 illustrate cross-sectional views of some embodiments of a method for forming an integrated chip comprising a solid-state power storage device over a transistor device.

As shown in cross-sectional view 1100 of FIG. 11, a transistor device 104 is formed along a substrate 102. In some embodiments, forming the transistor device 104 may comprise doping regions of the substrate 102 to form source/drains 106 in the substrate 102, depositing a gate dielectric and a gate material over the substrate 102, and patterning the gate material and the gate dielectric to form a gate structure 108 over the substrate 102 and separated from the substrate by a gate dielectric 110.

Figure 12:
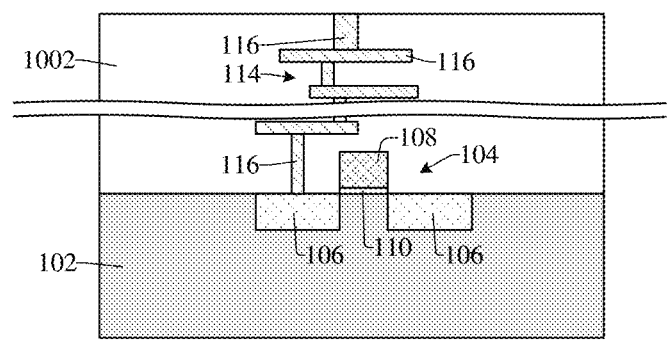

As shown in cross-sectional view 1200 of FIG. 12, an interconnect structure 114 comprising metal wires 116 is formed within one or more first dielectric layers 1002 over the transistor device 104. In some embodiments, forming the interconnect structure 114 comprises depositing the one or more first dielectric layers 1002 over the substrate 102, patterning the one or more first dielectric layers 1002, and depositing metal over the patterned first dielectric layer(s) to form the metal wires 116 within the first dielectric layer(s) 1002.

FIGS. 13A, 14A, 15A, 16A, 17A, and 18A illustrate some embodiments of a first method for forming a solid-state power storage device 118 over the transistor device 104. FIGS. 13B, 14B, 15B, 16B, 17B, and 18B illustrate some embodiments of a second method for forming a solid-state power storage device 118 over the transistor device 104.

Figure 13A:
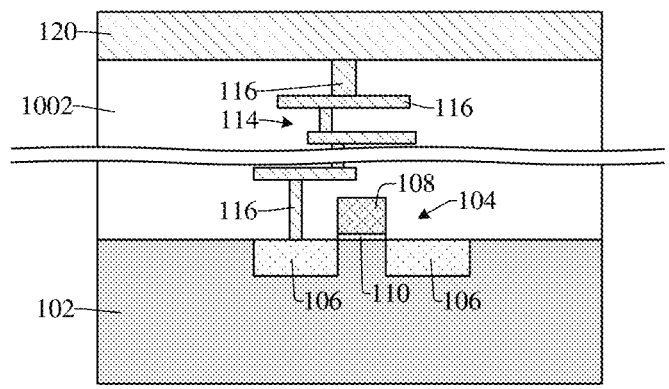

As shown in cross-sectional view 1300a of FIG. 13A, a first metal layer 120 is deposited over the one or more first dielectric layers 1002. In some embodiments, the first metal layer 120 is deposited on a metal wire 116 of the interconnect structure 114. In some embodiments, the first metal layer 120 comprises ruthenium, some other transition metal, or some other suitable material and may be deposited over the first dielectric layer(s) 1002 by a chemical vapor deposition (CVD) process, a physical vapor deposition (PVD) process, an atomic layer deposition (ALD) process, or some other suitable process.

Figure 13B:
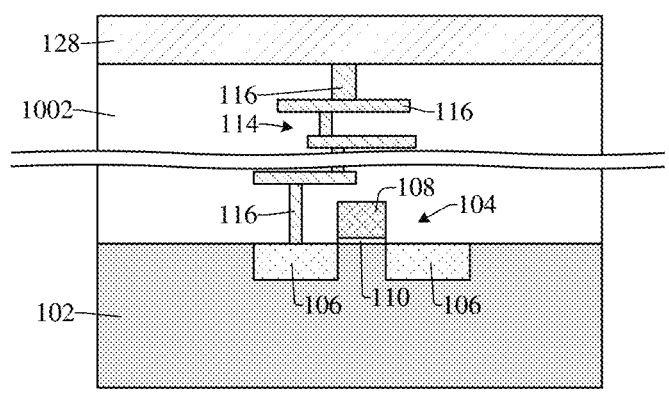

As shown in cross-sectional view 1300b of FIG. 13B, a second metal layer 128 is deposited over the one or more first dielectric layers 1002. In some embodiments, the second metal layer 128 is deposited on a metal wire 116 of the interconnect structure 114. In some embodiments, the second metal layer 128 comprises titanium nitride, aluminum, ruthenium, or some other suitable material and may be deposited over the first dielectric layer(s) 1002 by a CVD process, a PVD process, an ALD process, or some other suitable process.

Figure 14A:
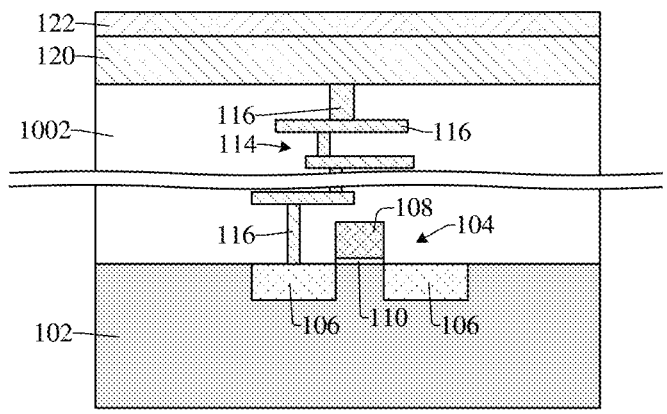

As shown in cross-sectional view 1400a of FIG. 14A, a metal oxide layer 122 is formed on the first metal layer 120 along a top surface of the first metal layer 120. In some embodiments, forming the metal oxide layer 122 on the first metal layer 120 comprises exposing the first metal layer 120 to air so that the first metal layer 120 experiences reduction-oxidation along the top surface, thereby forming the metal oxide layer 122 along the top surface of the first metal layer 120. In some other embodiments, forming the metal oxide layer 122 on the first metal layer 120 comprises depositing the metal oxide layer 122 (e.g., ruthenium oxide, some other transition metal oxide, or some other suitable material) by a CVD process, and electroplating process, or some other suitable process.

Figure 14B:
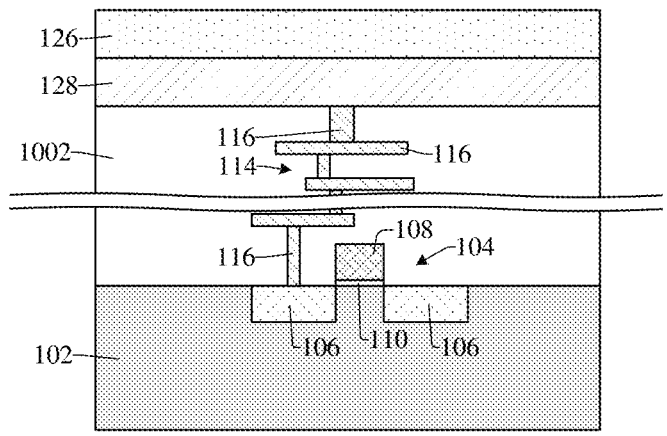

As shown in cross-sectional view 1400b of FIG. 14B, an ionic crystal layer 126 is deposited on the second metal layer 128. In some embodiments, the ionic crystal layer 126 comprises a metal halide, a metal oxide, a metal nitride, a metal sulfide, or some other suitable material and may be deposited on the second metal layer 128 by a CVD process, a PVD process, an ALD process, or some other suitable process.

Figure 15A:
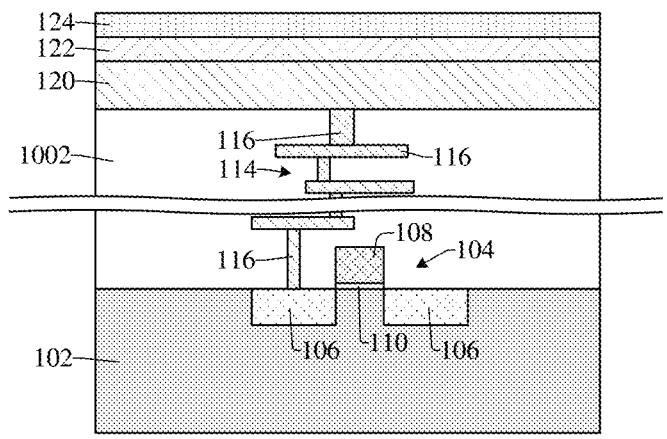

As shown in cross-sectional view 1500a of FIG. 15A, a hydrous metal oxide layer 124 is formed on the metal oxide layer 122 along a top surface of the metal oxide layer 122. In some embodiments, forming the hydrous metal oxide layer 124 on the metal oxide layer 122 comprises exposing the metal oxide layer 122 to water to form the hydrous metal oxide layer 124 along a top surface of the metal oxide layer 122. For example, the hydrous metal oxide layer 124 may be formed by performing an ALD water pulse process that provides water to the top surface of the metal oxide layer 122. The water reacts with the metal oxide layer 122 to form the hydrous metal oxide layer 124 along the top surface of the metal oxide layer 122. In some other embodiments, forming the hydrous metal oxide layer 124 comprises depositing the hydrous metal oxide layer 124 (e.g., hydrous ruthenium oxide, some hydrous transition metal oxide, or some other suitable material) by a low temp thermal deposition process, a CVD process, or some other suitable process.

Figure 15B:
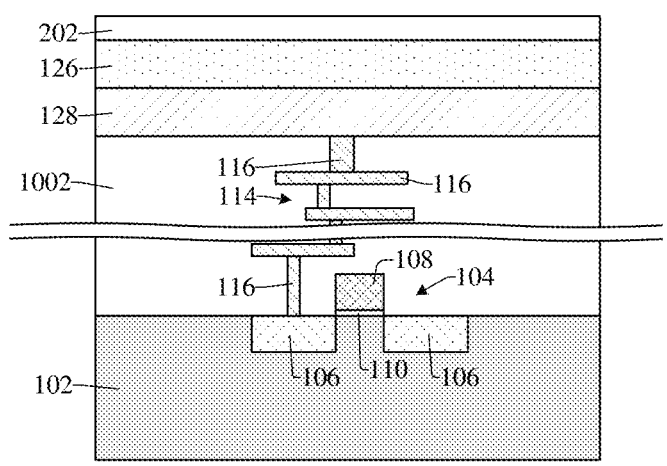

As shown in cross-sectional view 1500b of FIG. 15B, a dielectric layer 202 may be deposited on the ionic crystal layer 126. In some embodiments, the dielectric layer 202 comprises aluminum oxide, hafnium oxide, zirconium oxide, some other high-k dielectric, or some other suitable material and may be deposited on the ionic crystal layer 126 by a CVD process or some other suitable process.

Figure 16A:
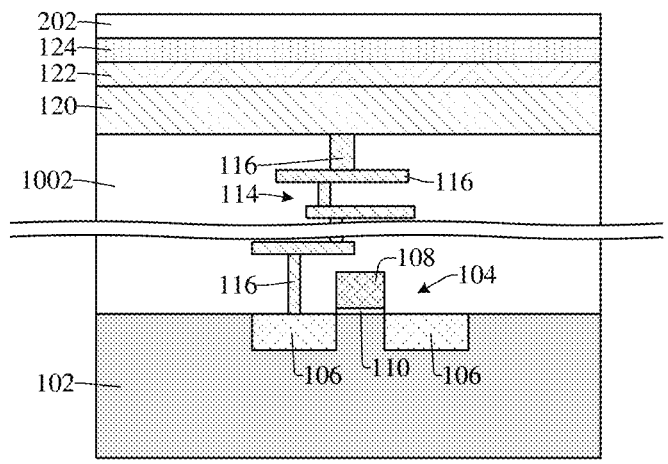

As shown in cross-sectional view 1600a of FIG. 16A, a dielectric layer 202 may be deposited on the hydrous metal oxide layer 124. In some embodiments, the dielectric layer 202 may be deposited on the hydrous metal oxide layer 124 by a CVD process or some other suitable process.

Figure 16B:
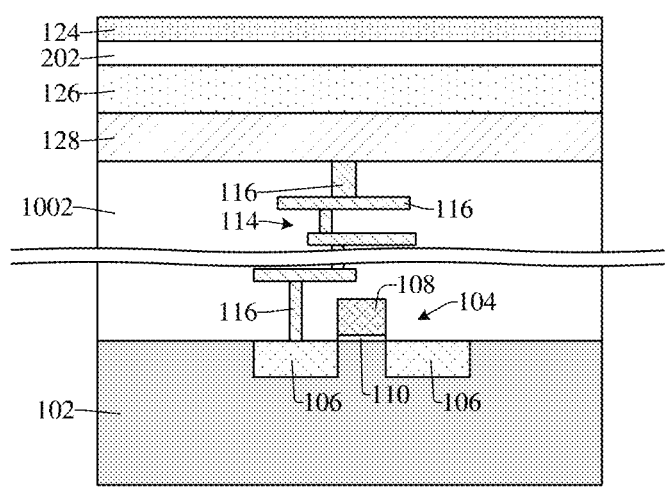

As shown in cross-sectional view 1600b of FIG. 16B, a hydrous metal oxide layer 124 is deposited on the dielectric layer 202 (or on the ionic crystal layer 126, for example, in some embodiments where the integrated chip is devoid of the dielectric layer 202). In some embodiments, the hydrous metal oxide layer 124 comprises hydrous ruthenium oxide, some hydrous transition metal oxide, or some other suitable material and may be deposited on the dielectric layer 202 (or on the ionic crystal layer 126) by a low temperature thermal deposition process, a CVD process, or some other suitable process.

Figure 17A:
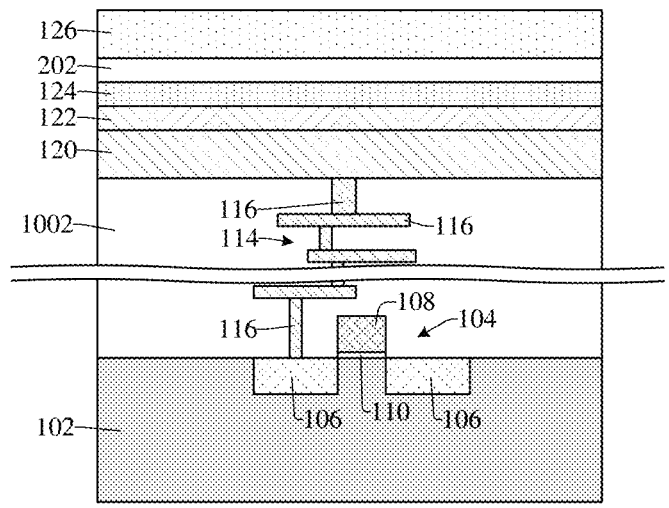

As shown in cross-sectional view 1700a of FIG. 17A, an ionic crystal layer 126 is deposited on the dielectric layer 202 (or on the hydrous metal oxide layer 124, for example, in some embodiments where the integrated chip is devoid of the dielectric layer 202). In some embodiments, the ionic crystal layer 126 comprises a metal halide, a metal oxide, a metal nitride, a metal sulfide, or some other suitable material and may be deposited on the dielectric layer 202 (or on the hydrous metal oxide layer 124) by a CVD process, a PVD process, an ALD process, or some other suitable process.

Figure 17B:
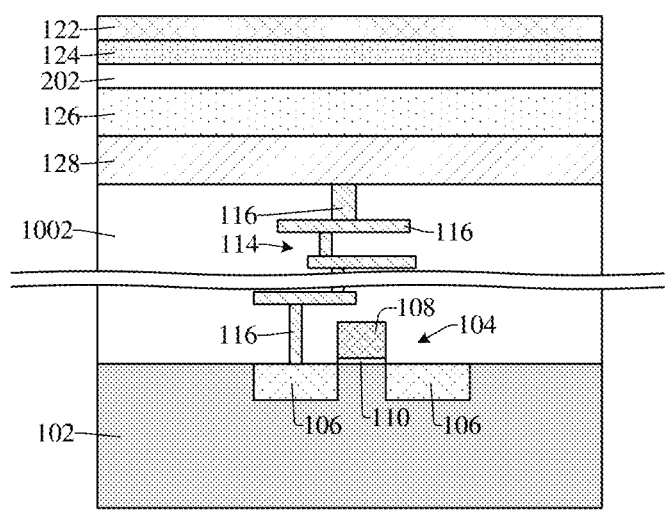

As shown in cross-sectional view 1700b of FIG. 17B, a metal oxide layer 122 is deposited on the hydrous metal oxide layer 124. In some embodiments, the metal oxide layer 122 comprises ruthenium oxide, some other transition metal oxide, or some other suitable material and may be deposited on the hydrous metal oxide layer 124 by a CVD process or some other suitable process.

Figure 18A:
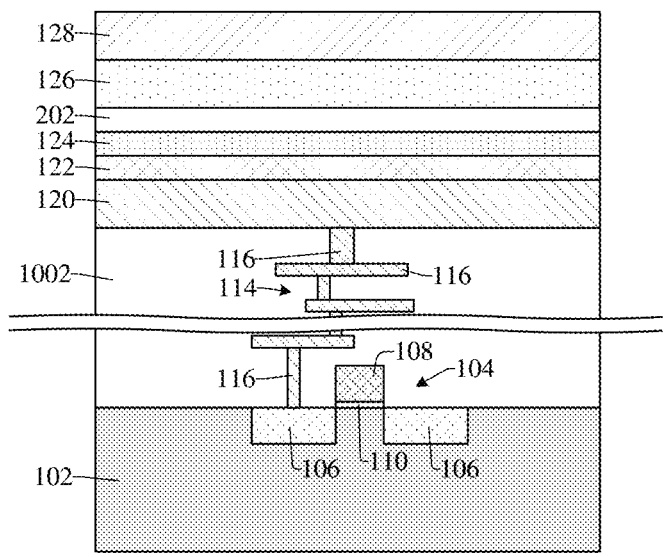

As shown in cross-sectional view 1800a of FIG. 18A, a second metal layer 128 is deposited on the ionic crystal layer 126. In some embodiments, the second metal layer 128 comprises titanium nitride, aluminum, ruthenium, or some other suitable material and may be deposited on the ionic crystal layer 126 by a CVD process, a PVD process, an ALD process, or some other suitable process.

Figure 18B:
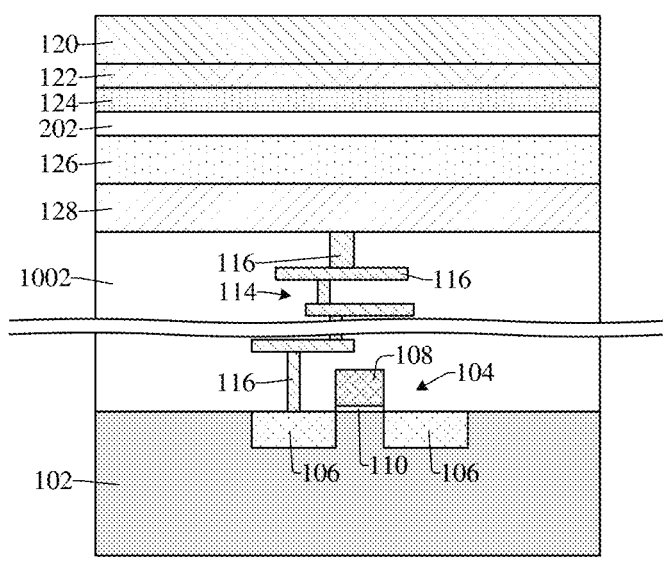

As shown in cross-sectional view 1800b of FIG. 18B, a first metal layer 120 is deposited on the metal oxide layer 122. In some embodiments, the first metal layer 120 comprises ruthenium, some other transition metal, or some other suitable material and may be deposited on the metal oxide layer 122 by a CVD process, a PVD process, an ALD process, or some other suitable process.

FIGS. 19-22 illustrate some embodiments of a remainder of the method for forming the integrated chip. Although FIGS. 19-22 illustrate the solid-state power storage device 118 having the first orientation (e.g., as shown in FIGS. 1, 2, and 18A) during the remained of the method, it will be appreciated that in some embodiments, the solid-state power storage device 118 may alternatively have the second orientation (e.g., as shown in FIGS. 3 and 18B) during the remainder of the method.

Figure 19:
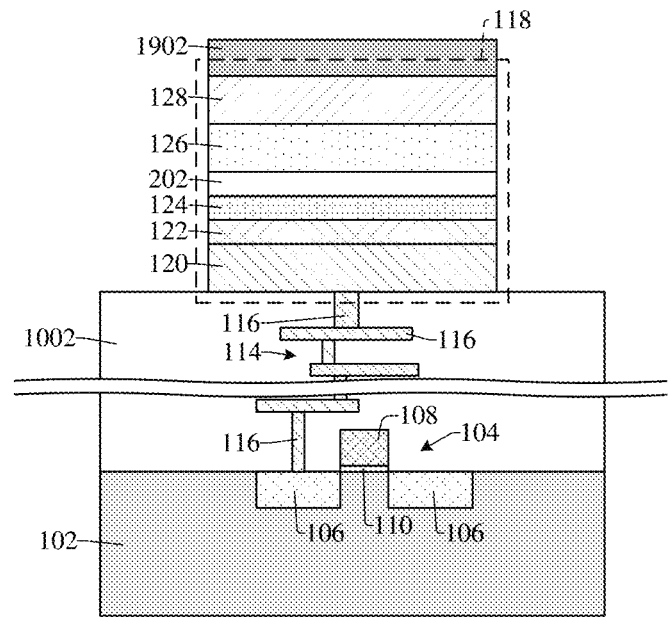

As shown in cross-sectional view 1900 of FIG. 19, the second metal layer 128, the ionic crystal layer 126, the dielectric layer 202, the hydrous metal oxide layer 124, the metal oxide layer 122, and the first metal layer 120 are patterned according a masking layer 1902 to form the solid-state power storage device 118. In some embodiments, the patterning comprises forming the masking layer 1902 over the second metal layer 128 and etching the aforementioned layers with the masking layer 1902 in place. In some embodiments, the etching may comprise a dry etching process such as, for example, a reactive ion etching (RIE) process, an ion beam etching (IBE) process, or some other suitable process. In some embodiments, the masking layer 1902 may be or comprise a hard mask, a photoresist mask, or the like. In some embodiments, the masking layer 1902 may be removed after the etching.

Figure 20:
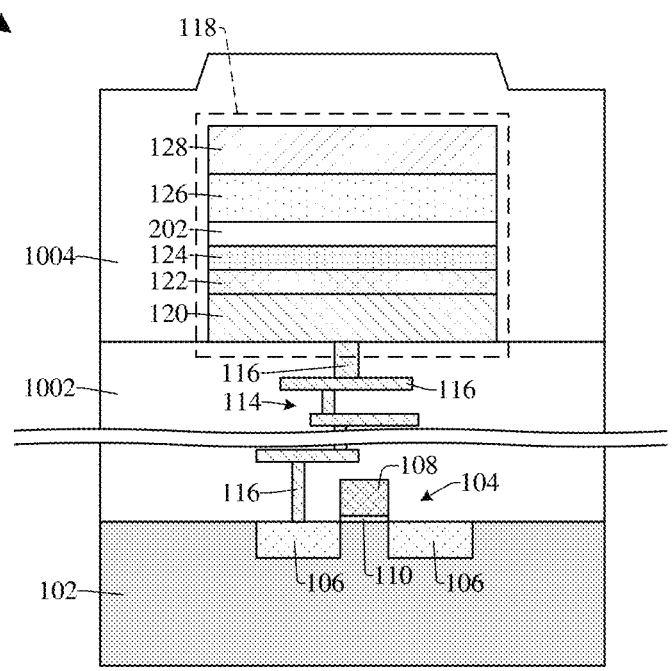

As shown in cross-sectional view 2000 of FIG. 20, one or more second dielectric layers 1004 are deposited over the substrate 102, over the solid-state power storage device 118, and along opposing sidewalls of the solid-state power storage device 118. In some embodiments, the one or more second dielectric layers 1004 may comprise silicon dioxide, silicon nitride, or some other suitable material and may be deposited by a CVD process or some other suitable process.

Figure 21:
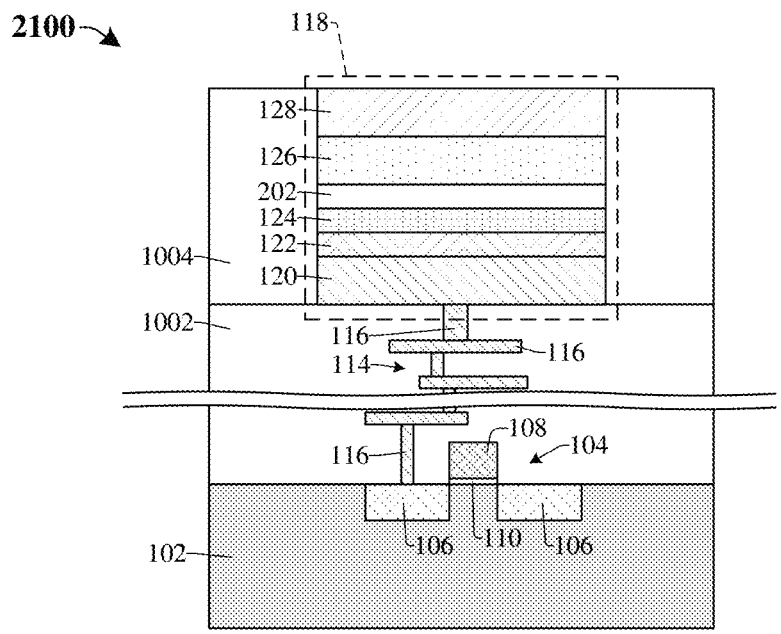

As shown in cross-sectional view 2100 of FIG. 21, a planarization process is performed on the one or more second dielectric layers 1004. The planarization process may also be performed on the second metal layer 128. In some embodiments, a top surface of the second metal layer 128 and a top surface of the one or more second dielectric layers 1004 may be coplanar after the planarization process is performed. In some embodiments, the planarization process may comprise a chemical mechanical planarization (CMP) process or some other suitable process.

Figure 22:
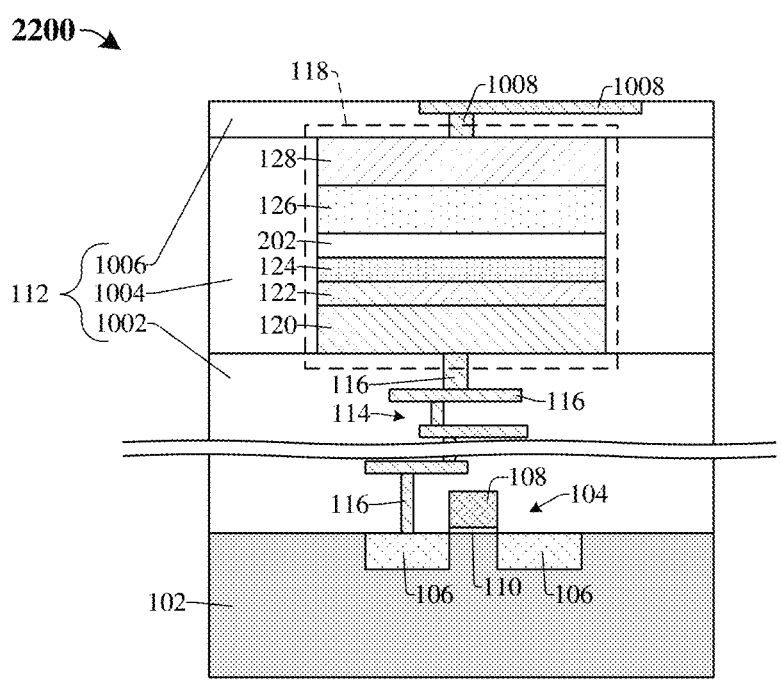
Figure 23A:
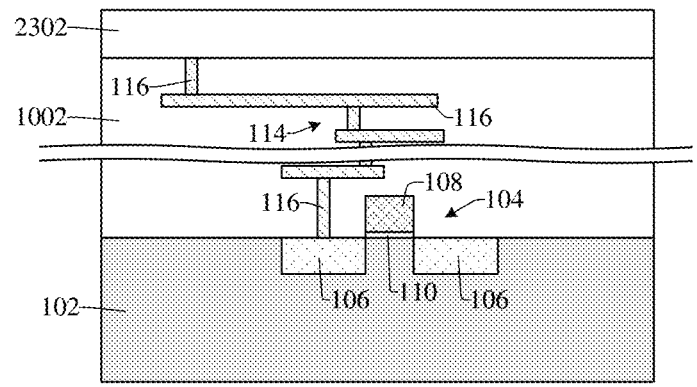
FIGS. 23A, 23B, 23C, 23D, 24A, 24B, 24C, 24D, 25A, 25B, 25C, 25D, 26A, 26B, 26C, and 26D illustrate cross-sectional views of some embodiments of a method for forming an integrated chip comprising a solid-state power storage device with layers having varied surfaces.
Figure 23B:
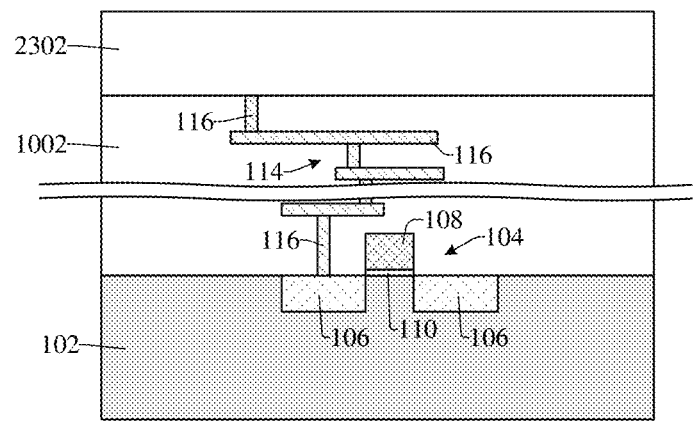
Figure 23C:
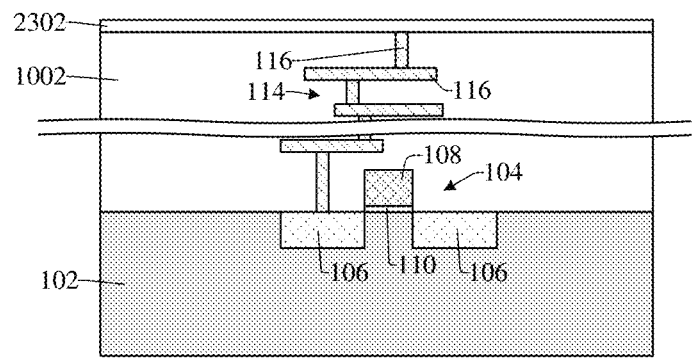
Figure 23D:
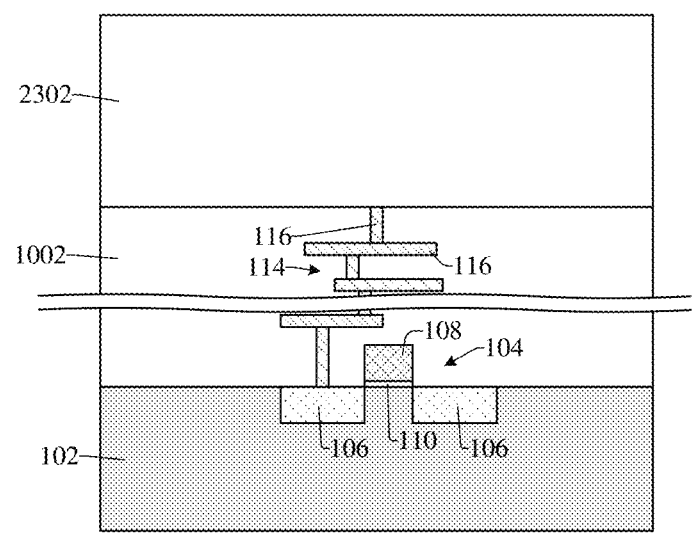
Figure 24A:
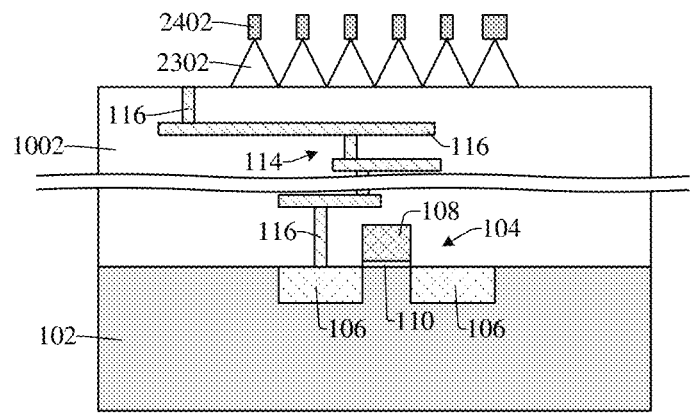
Figure 24B:
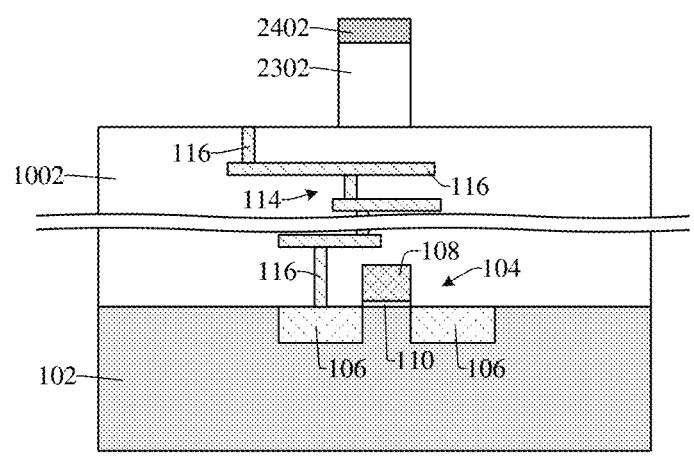
Figure 24C:
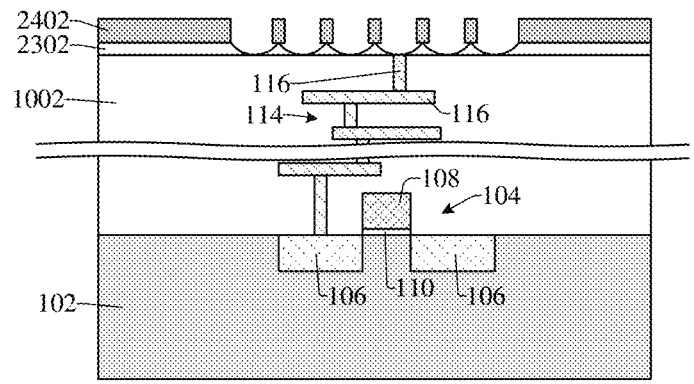
Figure 24D:
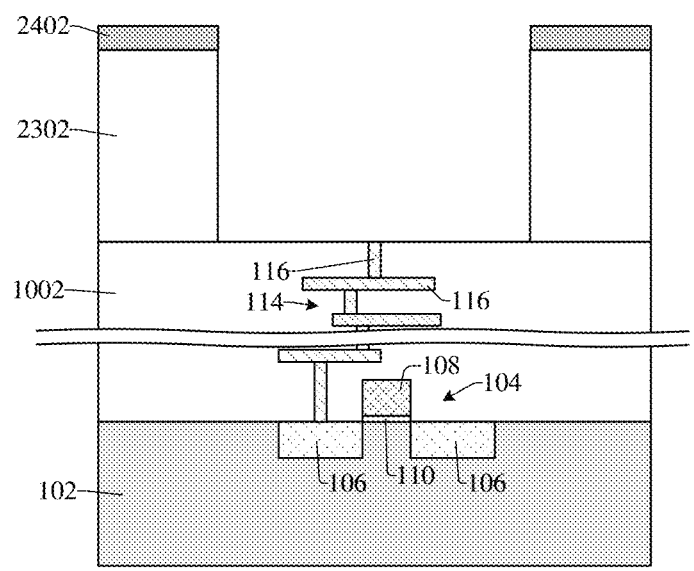
Figure 25A:
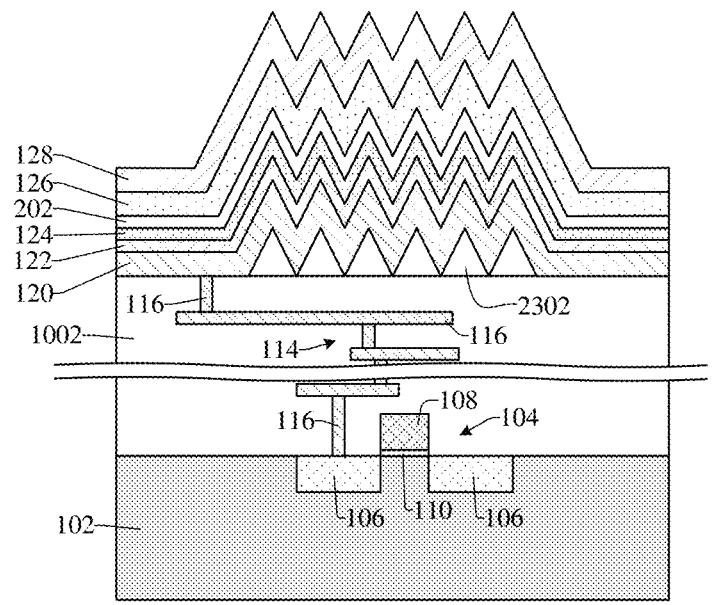
Figure 25B:
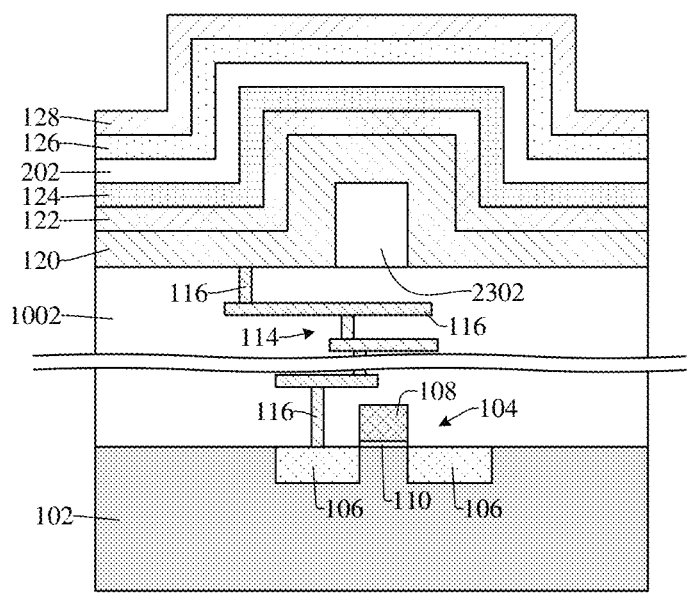
Figure 25C:
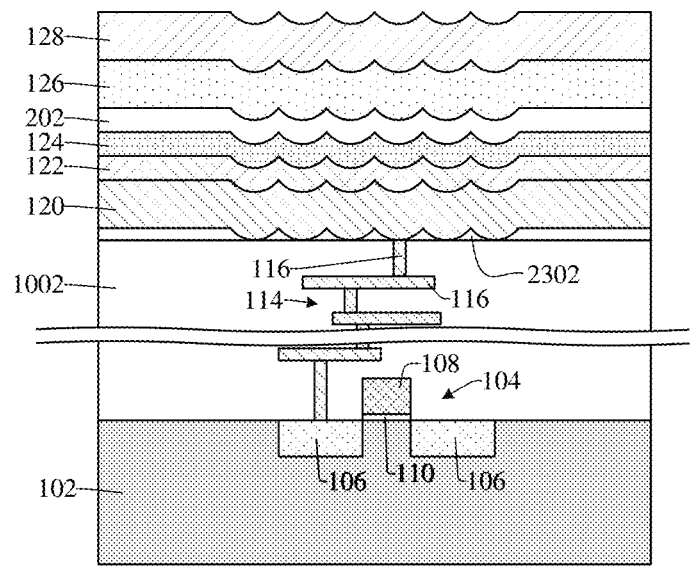
Figure 25D:
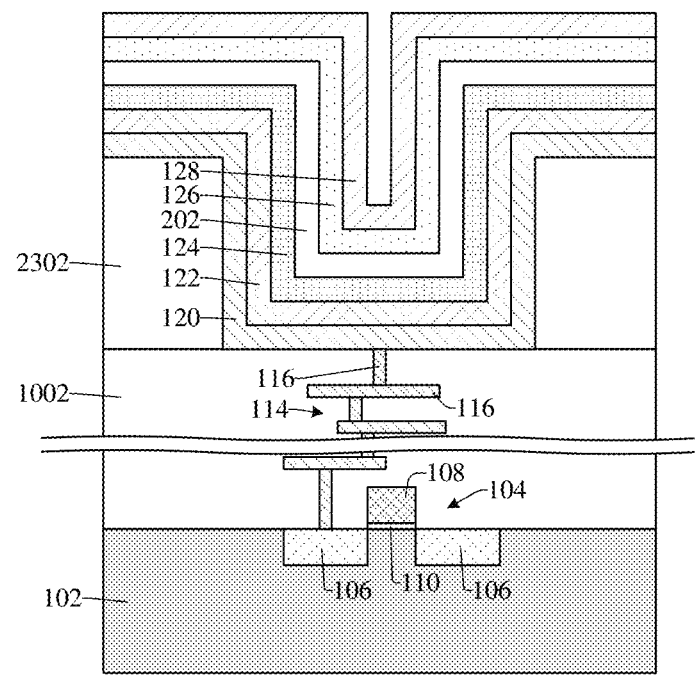

As shown in cross-sectional view 2200 of FIG. 22, one or more third dielectric layers 1006 are deposited over the solid-state power storage device 118 and one or more metal wires 1008 are formed within third dielectric layer(s) 1006 over the solid-state power storage device 118. In some embodiments, the third dielectric layer(s) 1006 may comprise silicon dioxide, silicon nitride, or some other suitable material and may be deposited by a CVD process or some other suitable process. In some embodiments, the one or more metal wires 1008 may be formed within the third dielectric layer(s) 1006 by patterning the third dielectric layer(s) 1006 and depositing a metal over the patterned third dielectric layer(s).

FIGS. 23A, 23B, 23C, 23D, 24A, 24B, 24C, 24D, 25A, 25B, 25C, 25D, 26A, 26B, 26C, and 26D illustrate cross-sectional views 2300a, 2300b, 2300c, 2300d, 2400a, 2400b, 2400c, 2400d, 2500a, 2500b, 2500c, 2500d, 2600a, 2600b, 2600c, and 2600d of some embodiments of a method for forming an integrated chip comprising a solid-state power storage device 118 with layers having varied surfaces.

Although FIGS. 23A, 23B, 23C, 23D, 24A, 24B, 24C, 24D, 25A, 25B, 25C, 25D, 26A, 26B, 26C, and 26D are described in relation to a method, it will be appreciated that the structures disclosed in FIGS. 23A, 23B, 23C, 23D, 24A, 24B, 24C, 24D, 25A, 25B, 25C, 25D, 26A, 26B, 26C, and 26D are not limited to such a method, but instead may stand alone as structures independent of the method.

FIGS. 23A, 24A, 25A, and 26A, illustrate some embodiments of a first method for forming a solid-state power storage device 118. FIGS. 23B, 24B, 25B, and 26B, illustrate some embodiments of a second method for forming a solid-state power storage device 118. FIGS. 23C, 24C, 25C, and 26C, illustrate some embodiments of a third method for forming a solid-state power storage device 118. FIGS. 23D, 24D, 25D, and 26D, illustrate some embodiments of a fourth method for forming a solid-state power storage device 118.

As shown in cross-sectional views 2300a, 2300b, 2300c, and 2300d of FIGS. 23A, 23B, 23C, and 23D, a transistor device 104 is formed along a substrate 102, and an interconnect structure 114 comprising metal wires 116 is formed within one or more first dielectric layers 1002 over the substrate 102. A dielectric layer 2302 is then formed over the interconnect structure 114.

As shown in cross-sectional views 2400a, 2400b, 2400c, and 2400d of FIGS. 24A, 24B, 24C, and 24D, the dielectric layer 2302 is patterned according to a masking layer 2402. In some embodiments, the patterning comprises forming the masking layer 2402 over the dielectric layer 2302 and etching the dielectric layer 2302 with the masking layer 2402 in place. In some embodiments, the etching may comprise a dry etching process (e.g., an RIE process, an IBE process, or the like), a wet etching process (e.g., using potassium hydroxide, tetramethylammonium hydroxide, hydrofluoric acid, or the like), or some other suitable process. In some embodiments, the masking layer 2402 may be or comprise a hard mask, a photoresist mask, or the like. In some embodiments, the masking layer 2402 may be removed after the etching.

As shown in cross-sectional views 2500a, 2500b, 2500c, and 2500d of FIGS. 25A, 25B, 25C, and 25D, a first metal layer 120 is conformally deposited over the dielectric layer 2302 and first dielectric layer(s) 1002. A metal oxide layer 122 is formed along a top surface of the first metal layer 120. A hydrous metal oxide layer 124 is formed along a top surface of the metal oxide layer 122. A dielectric layer 202 may be conformally deposited over the hydrous metal oxide layer 124. An ionic crystal layer 126 is conformally deposited over the dielectric layer 202. A second metal layer 128 is conformally deposited over the ionic crystal layer 126.

Figure 26A:
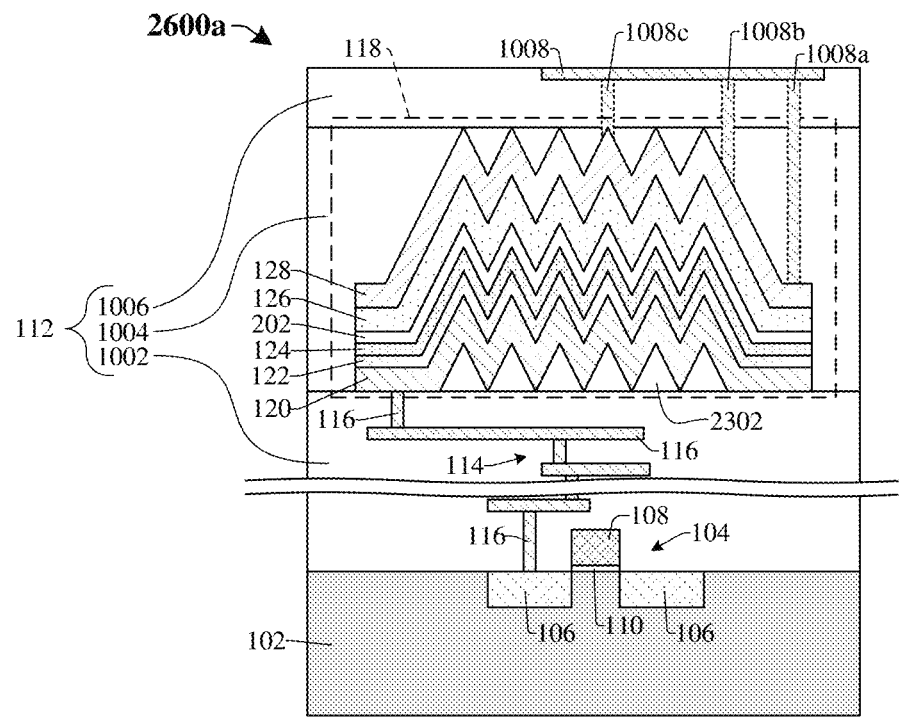
Figure 26B:
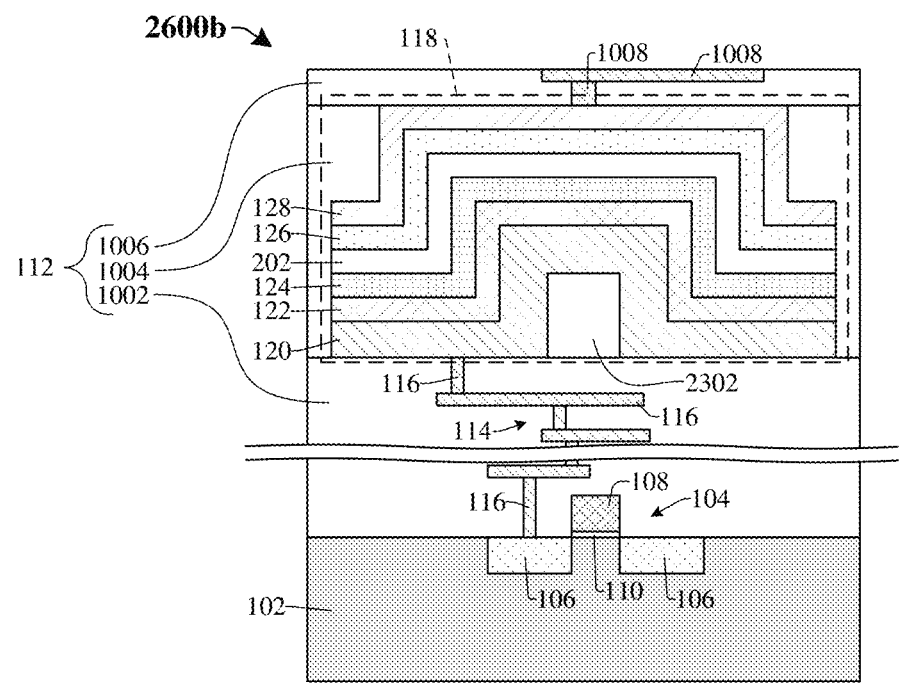
Figure 26C:
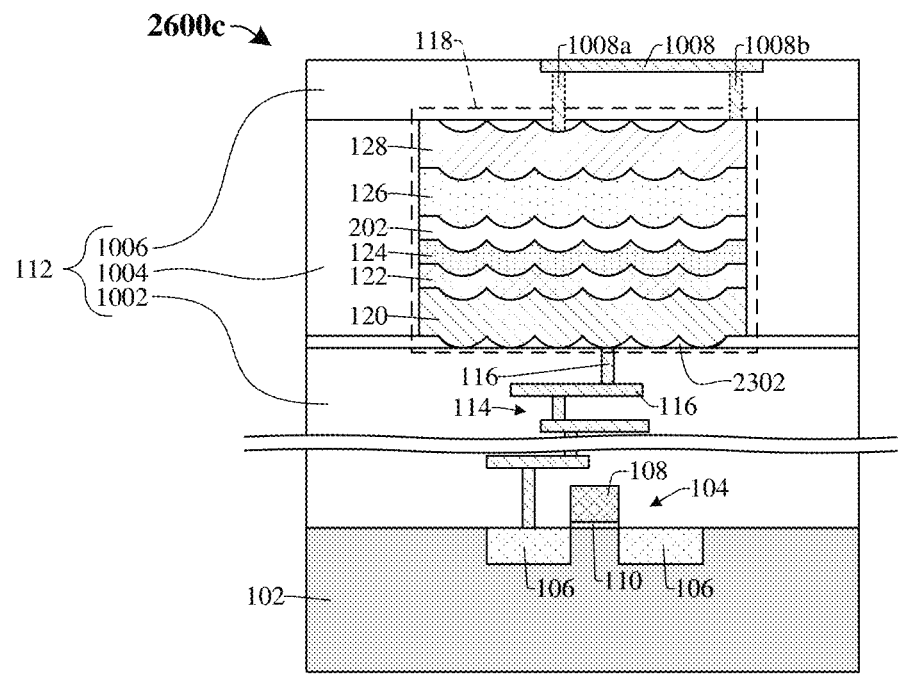
Figure 26D:
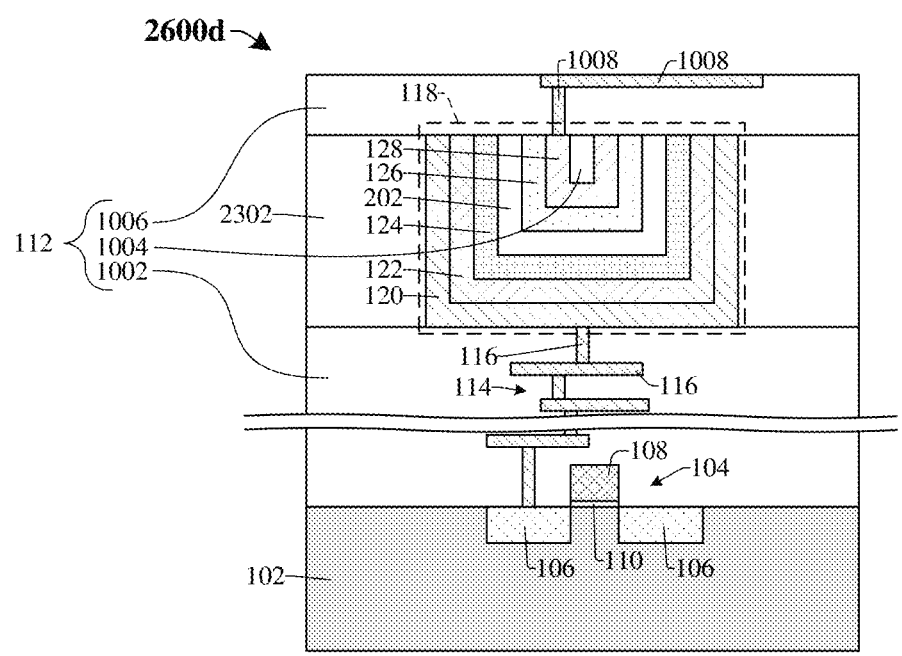

As shown in cross-sectional views 2600a, 2600b, 2600c, and 2600d of FIGS. 26A, 26B, 26C, and 26D, the first metal layer 120, the metal oxide layer 122, the hydrous metal oxide layer 124, the dielectric layer 202, the ionic crystal layer 126, and the second metal layer 128 may be patterned (e.g., as shown in FIGS. 26A, 26B, and 26C) or planarized (e.g., as shown in FIG. 26D). One or more second dielectric layers 1004 may then be deposited over the aforementioned layers. One or more third dielectric layers 1006 may then be deposited over the second dielectric layer(s) 1004 and over the second metal layer 128. One or more metal wires 1008 may then be formed within the one or more third dielectric layers 1006 and over the second metal layer 128. In some embodiments (e.g., as shown in FIG. 26A) a first metal wire 1008a, a second metal wire 1008b, or a third metal wire 1008c may be formed on the second metal layer 128. In some other embodiments (e.g., as shown in FIG. 26C), a first metal wire 1008a or a second metal wire 1008b may be formed on the second metal layer 128.

Figure 27:
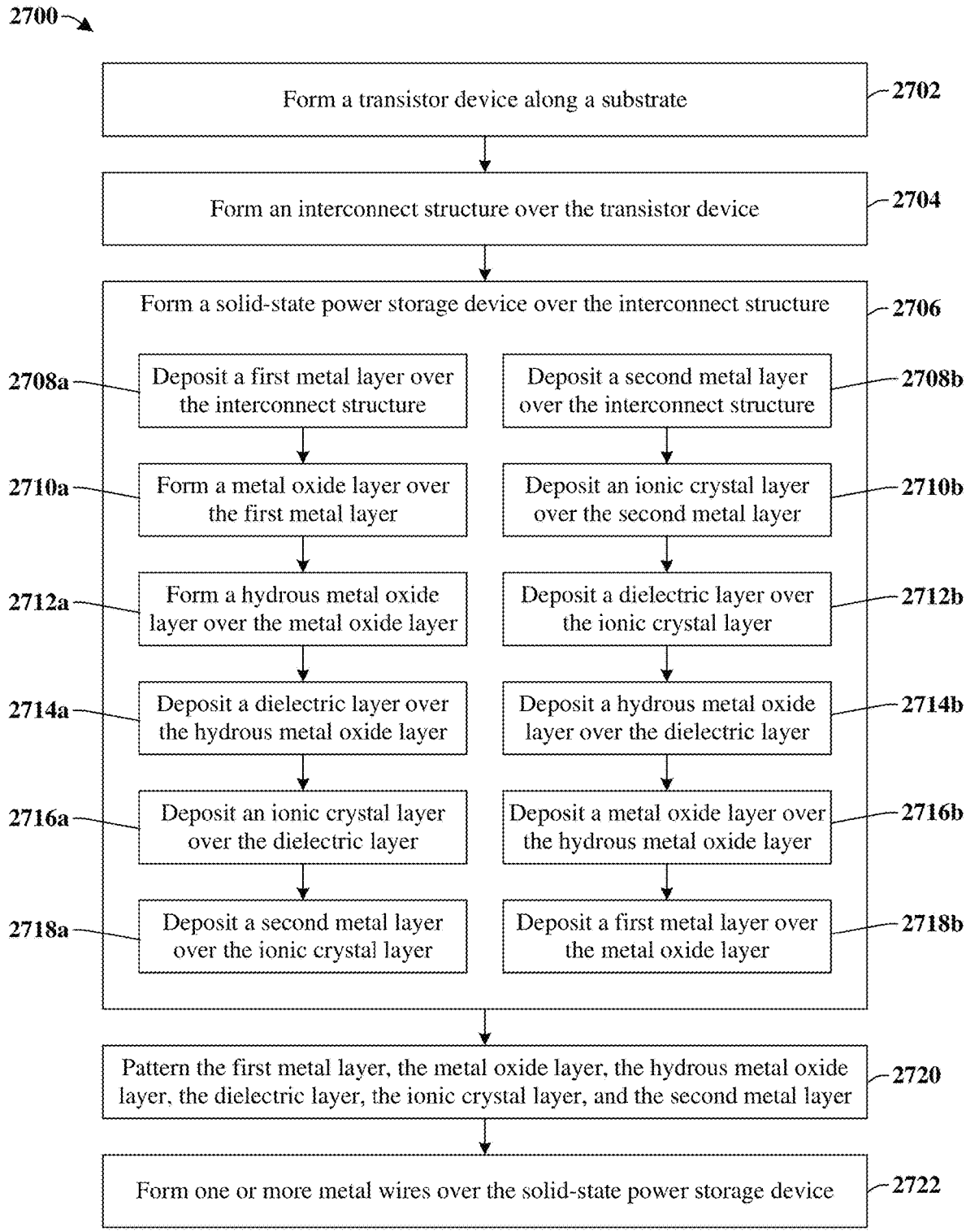
FIG. 27 illustrates a flow diagram of some embodiments of a method for forming an integrated chip comprising a solid-state power storage device over a transistor device.

FIG. 27 illustrates a flow diagram of some embodiments of a method 2700 for forming an integrated chip comprising a solid-state power storage device over a transistor device. While method 2700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, form a transistor device along a substrate. FIG. 11 illustrates a cross-sectional view 1100 of some embodiments corresponding to act 2702.

At 2704, form an interconnect structure over the transistor device. FIG. 12 illustrates a cross-sectional view 1200 of some embodiments corresponding to act 2704.

At 2706, form a solid-state power storage device over the interconnect structure. FIGS. 13A, 13B, 14A, 14B, 15A, 15B, 16A, 16B, 17A, 17B, 18A, and 18B illustrate cross-sectional views 1300a, 1300b, 1400a, 1400b, 1500a, 1500b, 1600a, 1600b, 1700a, 1700b, 1800a, and 1800b of some embodiments corresponding to act 2706. In some embodiments, act 2706 includes acts 2708a, 2710a, 2712a, 2714a, 2716a, and 2718a. In some other embodiments, act 2706 includes acts 2708b, 2710b, 2712b, 2714b, 2716b, and 2718b.

At 2708a, deposit a first metal layer over the interconnect structure. FIG. 13A illustrates a cross-sectional view 1300a of some embodiments corresponding to act 2708a.

At 2708b, deposit a second metal layer over the interconnect structure. FIG. 13B illustrates a cross-sectional view 1300b of some embodiments corresponding to act 2708b.

At 2710a, form a metal oxide layer over the first metal layer. FIG. 14A illustrates a cross-sectional view 1400a of some embodiments corresponding to act 2710a.

At 2710b, deposit an ionic crystal layer over the second metal layer. FIG. 14B illustrates a cross-sectional view 1400b of some embodiments corresponding to act 2710b.

At 2712a, form a hydrous metal oxide layer over the metal oxide layer. FIG. 15A illustrates a cross-sectional view 1500a of some embodiments corresponding to act 2712a.

At 2712b, deposit a dielectric layer over the ionic crystal layer. FIG. 15B illustrates a cross-sectional view 1500b of some embodiments corresponding to act 2712b.

At 2714a, deposit a dielectric layer over the hydrous metal oxide layer. FIG. 16A illustrates a cross-sectional view 1600a of some embodiments corresponding to act 2714a.

At 2714b, deposit a hydrous metal oxide layer over the dielectric layer. FIG. 16B illustrates a cross-sectional view 1600b of some embodiments corresponding to act 2714b.

At 2716a, deposit an ionic crystal layer over the dielectric layer. FIG. 17A illustrates a cross-sectional view 1700a of some embodiments corresponding to act 2716a.

At 2716b, deposit a metal oxide layer over the hydrous metal oxide layer. FIG. 17B illustrates a cross-sectional view 1700b of some embodiments corresponding to act 2716b.

At 2718a, deposit a second metal layer over the ionic crystal layer. FIG. 18A illustrates a cross-sectional view 1800a of some embodiments corresponding to act 2718a.

At 2718*b*, deposit a first metal layer over the metal oxide layer. FIG. 18B illustrates a cross-sectional view 1800*b* of some embodiments corresponding to act 2718*b*.

At 2720, pattern the first metal layer, the metal oxide layer, the hydrous metal oxide layer, the dielectric layer, the ionic crystal layer, and the second metal layer. FIG. 19 illustrates a cross-sectional view 1900 of some embodiments corresponding to act 2720.

At 2722, form one or more metal wires over the solid-state power storage device. FIGS. 20, 21, and 22 illustrate cross-sectional views 2000, 2100, and 2200 of some embodiments corresponding to act 2722.

Thus, the present disclosure relates to an integrated chip and a method for forming the integrated chip, the integrated chip including a solid-state power storage device over a transistor device.

Accordingly, in some embodiments, the present disclosure relates to an integrated chip comprising a first metal layer over a substrate. A second metal layer is over the first metal layer. An ionic crystal layer is between the first metal layer and the second metal layer. A metal oxide layer is between the first metal layer and the second metal layer. The first metal layer, the second metal layer, the ionic crystal layer, and the metal oxide layer are over a transistor device that is arranged along the substrate.

In other embodiments, the present disclosure relates to an integrated chip comprising a transistor device arranged along a substrate. A dielectric structure is over the substrate and extends along the substrate. A plurality of wires are within the dielectric structure. A first metal layer is over the plurality of wires. A second metal layer is over the first metal layer. An ionic crystal layer is between the first metal layer and the second metal layer. A metal oxide layer is between the first metal layer and the second metal layer. A hydrous metal oxide layer is between the ionic crystal layer and the metal oxide layer. The first metal layer, the second metal layer, the ionic crystal layer, the metal oxide layer, and the hydrous metal oxide layer are arranged within the dielectric structure.

In yet other embodiments, the present disclosure relates to a method for forming an integrated chip. The method comprises depositing a first metal layer over a transistor device that is arranged along a substrate. The first metal layer is exposed to air to form a metal oxide layer along a top surface of the first metal layer. The metal oxide layer is exposed to water to form a hydrous metal oxide layer along a top surface of the metal oxide layer. An ionic crystal layer is deposited over the hydrous metal oxide layer. A second metal layer is deposited over the ionic crystal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
   depositing a first metal layer over a transistor device that is arranged along a substrate;
   exposing the first metal layer to air to form a metal oxide layer along a top surface of the first metal layer;
   exposing the metal oxide layer to water to form a hydrous metal oxide layer along a top surface of the metal oxide layer;
   depositing an ionic crystal layer over the hydrous metal oxide layer; and
   depositing a second metal layer over the ionic crystal layer.

2. The method of claim 1, further comprising:
   depositing a dielectric layer over the hydrous metal oxide layer, wherein the ionic crystal layer is deposited over the dielectric layer.

3. The method of claim 1, further comprising:
   patterning the first metal layer, the metal oxide layer, the ionic crystal layer, and the second metal layer to form a solid-state power storage device; and
   depositing a dielectric layer over the solid-state power storage device and along opposing sidewalls of the solid-state power storage device.

4. The method of claim 2, wherein the dielectric layer comprises a different material than the metal oxide layer and the hydrous metal oxide layer.

5. The method of claim 2, wherein the ionic crystal layer has a first thickness and the dielectric layer has a second thickness less than the first thickness.

6. The method of claim 1, wherein the first metal layer comprises a first metal, wherein the metal oxide layer comprises the first metal, and wherein the hydrous metal oxide layer comprises the first metal.

7. The method of claim 6, wherein the second metal layer comprises a second metal different than the first metal.

8. The method of claim 1, further comprising:
   forming a dielectric structure over the transistor device;
   depositing a dielectric layer over the dielectric structure; and
   patterning the dielectric layer, wherein the first metal layer is conformally deposited over the patterned dielectric layer and the dielectric structure.

9. The method of claim 8, wherein the first metal layer is conformally deposited on a first sidewall of the dielectric layer, a second sidewall of the dielectric layer, and an upper surface of the dielectric structure, wherein the ionic crystal layer is conformally deposited along a first sidewall, a second sidewall, and an upper surface of the hydrous metal oxide layer, and wherein the second metal layer is conformally deposited on a first sidewall, a second sidewall, and an upper surface of the ionic crystal layer.

10. The method of claim 1, further comprising:
    forming the transistor device along the substrate;
    forming a dielectric structure over the transistor device;
    forming a metal interconnect structure comprising a metal interconnect within the dielectric structure, wherein the first metal layer is deposited on the metal interconnect, and wherein the metal interconnect structure couples the transistor device to the first metal layer; and
    forming a metal contact on a top surface of the second metal layer.

11. A method for forming an integrated chip, the method comprising:
    depositing a first dielectric layer over a transistor device that is arranged along a semiconductor substrate;
    depositing a first metal layer comprising a first metal over the first dielectric layer;
    providing oxygen to a top surface of the first metal layer to form a metal oxide layer comprising the first metal along the top surface of the first metal layer;

providing water to a top surface of the metal oxide layer to form a hydrous metal oxide layer comprising the first metal along the top surface of the metal oxide layer;

depositing an ionic crystal layer comprising a second metal, different than the first metal, over the hydrous metal oxide layer; and depositing a second metal layer over the ionic crystal layer.

12. The method of claim 11, further comprising:

depositing a second metal oxide layer comprising a third metal, different than the first metal, over the hydrous metal oxide layer, wherein the ionic crystal layer is deposited over the second metal oxide layer.

13. The method of claim 11, wherein providing water to the metal oxide layer comprises performing an atomic layer deposition of water over the metal oxide layer.

14. The method of claim 11, wherein the ionic crystal layer has an ionic conductivity of greater than $10^{-5}$ Siemens per centimeter.

15. A method for forming an integrated chip, the method comprising:

depositing a first metal layer over a transistor device that is arranged along a substrate;

exposing the first metal layer to air to form a metal oxide layer along a top surface of the first metal layer;

exposing the metal oxide layer to water to form a hydrous metal oxide layer along a top surface of the metal oxide layer;

depositing a dielectric layer on a top surface of the hydrous metal oxide layer;

depositing an ionic crystal layer over the hydrous metal oxide layer and on a top surface of the dielectric layer; and depositing a second metal layer over the ionic crystal layer.

16. The method of claim 15, wherein the dielectric layer comprises a metal oxide comprising a first metal, and wherein the ionic crystal layer comprises a metal nitride comprising the first metal.

17. The method of claim 16, wherein the first metal layer, the metal oxide layer, and the hydrous metal oxide layer comprise a second metal different than the first metal.

18. The method of claim 17, wherein the second metal layer comprises a third metal different than the first metal and the second metal.

19. The method of claim 15, wherein a thickness of the dielectric layer is less than a thickness of the ionic crystal layer.

20. The method of claim 15, wherein a thickness of the dielectric layer is less than 2 nanometers.

* * * * *